United States Patent [19]

Levenstein

[11] Patent Number: 4,533,449
[45] Date of Patent: Aug. 6, 1985

[54] RAPID SURFACE FIGURING BY SELECTIVE DEPOSITION

[75] Inventor: Harold Levenstein, Danbury, Conn.

[73] Assignee: The Perkin-Elmer Corporation, Norwalk, Conn.

[21] Appl. No.: 600,760

[22] Filed: Apr. 16, 1984

[51] Int. Cl.³ .............................................. C23C 15/00
[52] U.S. Cl. .............................. 204/192 R; 156/345; 204/192 P; 204/298
[58] Field of Search ............... 204/192 R, 298, 192 P; 156/345

[56] References Cited

U.S. PATENT DOCUMENTS

| | | | |
|---|---|---|---|
| 4,313,815 | 2/1982 | Graves et al. | 204/298 |
| 4,322,276 | 3/1982 | Meckel et al. | 204/192 R |
| 4,332,833 | 6/1982 | Aspnes et al. | 204/192 R |
| 4,340,276 | 7/1982 | Maffitt et al. | 204/192 P |
| 4,379,040 | 4/1983 | Gillery | 204/192 R |
| 4,394,237 | 7/1983 | Donnelly et al. | 204/298 |
| 4,409,087 | 10/1983 | Quick | 204/192 R |
| 4,416,760 | 11/1983 | Turner | 204/192 R |
| 4,430,151 | 2/1984 | Tsukada | 156/345 |
| 4,431,499 | 2/1984 | Henager | 204/192 E |
| 4,454,001 | 6/1984 | Sternheim et al. | 204/192 E |

OTHER PUBLICATIONS

Gourley, Proc. Soc. Photo., Opt. Inst. Eng.; (USA) LASL Optics Conf. (1979), pp. 73-79.
Tolansky et al., Surface Microtopography: Interscience Publishers, N.Y., 1961, pp. 119-134.
Kokai 81-50516, Chem. Abst. 95 (1981), #72054.
Gill, Chem Abst. 93 (1980), #196200.
Bobylev, Chem. Abst. 92 (1980), #224369.
Weldner Chem. Abst. 94 (1981) #56852.

Primary Examiner—Arthur P. Demers
Attorney, Agent, or Firm—Thomas P. Murphy; Edwin T. Grimes; Francis L. Masselle

[57] ABSTRACT

An apparatus and method for reshaping an optical surface by the controlled deposition of material thereon. A deposition source is disposed adjacent the optical surface to be reshaped and moved relative to the surface under control of a computer depositing material onto the surface for reforming it into a predetermined shape.

4 Claims, 1 Drawing Figure

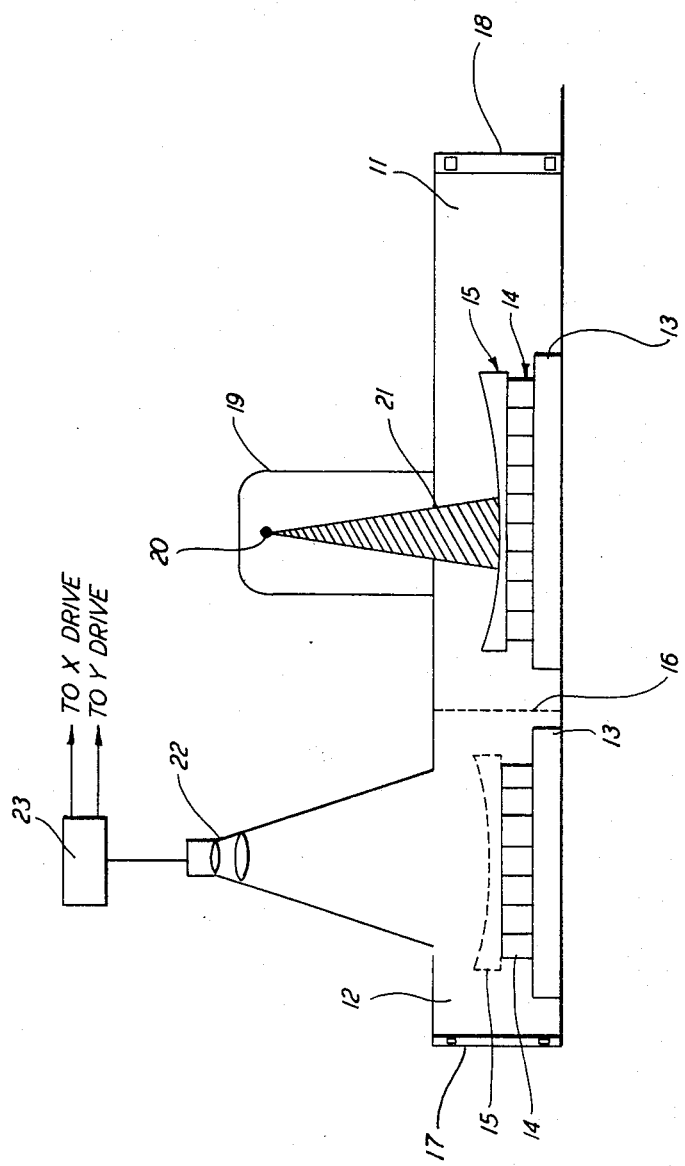

RAPID SURFACE FIGURING BY SELECTIVE DEPOSITION

BACKGROUND OF THE INVENTION

Present day methods of fabricating optical elements involve generally the steps of casting a blank and polishing its surface or surfaces to the required shape, e.g., concave, convex or aspheric, etc. In the fabrication of mirrors, e.g., of the type used in telescopes, the further step of coating the figured or refigured surface with appropriate reflective material is required. While the foregoing technique has proven quite satisfactory, it includes certain inherent disadvantages. For example, in polishing it is often difficult to figure or refigure the entire surface including edges of an element. Also, polishing a surface may cause "quilting" effects due to polishing pressure. Further, it should be noted that polishing even under computer control may inadvertently remove too much material, thus, in effect, destroying the usefulness of the blank.

The present invention overcomes the above-mentioned disadvantages and provides a method and apparatus for figuring or refiguring an optical surface which is much faster than the polishing method and is applicable to any specular substrate form or material.

BRIEF SUMMARY OF THE INVENTION

The present invention relates to a method and apparatus for the selective deposition of material onto the surface of an optical element for the purpose of shaping or reshaping the surface into a desired surface figure. In carrying out the present invention an optical element whose surface is to be figured or refigured is disposed in a vacuum chamber. A source of depositing material such as a sputter gun is also disposed in the vacuum chamber adjacent the surface to be figured or refigured and moved relative to the surface of the optical element. The amount of material deposited on the surface is a function of the dwell time of the source on any given area of the surface. Dwell time of the source is under computer control and is varied by program means to insure that the surface of the optical element is figured or refigured in accordance with a known mathematical model of a desired surface.

BRIEF DESCRIPTION OF THE DRAWING

The FIGURE illustrates in schematic form a preferred embodiment of the present invention.

DESCRIPTION

Referring to the FIGURE there is shown an apparatus for shaping or reshaping the surface of a mirror into the desired figure. While the description of the FIGURE refers to figuring or refiguring a mirror, it should be noted that the present invention may be used to figure or refigure the surface of refractory optical elements as well.

The apparatus of the FIGURE includes a vacuum chamber 11 and a metrology station 12. In vacuum chamber 11 there is shown a stage 13 capable of controlled movement in the X and Y directions by any conventional means (not shown). Disposed on the stage 13 is a mount 14 for supporting a mirror 15 or other optical element whose surface is to be figured or refigured.

The metrology station 12 and vacuum chamber 11 are separated by a vacuum lock 16. A loading port 17 permits ingress into metrology station 12 of a mirror to be figured and an unloading port 18 permits the finished mirror to be removed from the vacuum chamber.

The movable stage may be moved back and forth between vacuum chamber 11 and metrology station 12 to enable measurement of the surface of the mirror 15 after each deposition process performed in vacuum chamber 11.

Also disposed in vacuum chamber 11, e.g., in belljar 19 is the source 20 of deposition material which may comprise a circular magnetron, i.e., a sputter gun. The source 20 directs, i.e., sputters material toward the surface of mirror 15 via an aperture 21. Aperture 21 is used to control the profile of the deposited film.

The metrology chamber 12 includes interferometer 22 for measuring the surface figure of the mirror 15. This may be done several times during the figuring or refiguring of an optical surface. The surface figure measurements made by interferometer 22 is converted into appropriate data for input into computer 23 where it is compared with data representative of the required surface figure of the particular optical element whose surface is being figured or refigured. The computer 23 is programmed to cause stage 13 to vary dwell time of the source 20 on the surface of mirror 15 to build up the surface in accordance with the model stored in the computer.

In figuring the surface of an optical element according to the present invention it is preferable to start with a blank that has been stamped out with a specular surface that roughly approximates the desired surface figure. The blank is then placed in the metrology station onto table 13 and mount 14. Interferometer 22 then measures its current surface figure. The table 13 is then moved into vacuum chamber 11 via vacuum lock 13. At this point source 20 is energized and the deposition takes place in a scheduled manner, e.g., in raster scan fashion. The computer 23 compares actual surface figure data from interferometer 22 to stored data representative of the required surface figure and varies dwell time, i.e., speed of movement of the source 20, to deposit more or less material onto the surface of mirror 15 in accordance with the surface figure of the stored model. The table 13 is then transferred to metrology station where its surface figure is again measured. If the measured surface figure is still not within the desired tolerance of the stored model, the depositing process is repeated. This meets the requirement of the stored model at which time the mirror 15 may be unloaded and replaced by the next optical element to be figured or refigured.

The optical element that is figured or refigured may be refractive or reflective. This merely determines the choice of deposition material which may be a metal, dielectric or other material, e.g., silicon. A major consideration in choice of material is compatibility as to the thermal expansion coefficient between substrate and deposition material.

The circular magnetron for material deposition is preferred over other deposition sources, e.g., a planar magnetron, since it may be used in any orientation. Circular magnetrons also produce a distribution pattern which approximates a collimated beam with rapid fallout at the edges which enhances material utilization and minimizes heavy buildup of material in the deposition chamber.

Various other modifications of the present invention are possible in light of the above description which should not be construed as placing limitations on the present invention beyond those limitations expressly set forth in the claims which follow:

What is claimed is:

1. An apparatus for figuring an optical surface, comprising:
    a platform for supporting an optical element whose surface is to be figured,
    a material deposition source comprising a circular magnetron disposed adjacent said platform and adapted to be moved relative thereto,
    a vacuum chamber enclosing said source and platform,
    means for moving said platform relative to said source to vary the amount of material deposited onto said surface in accordance with a predetermined surface figure,
    interferometer means for measuring the figure of said surface,
    computer means connected to said interferometer means and storing a model of the desired surface figure,
    said computer means comparing the measured and stored surface to provide signals for moving said platform relative to said source to vary the amount of material deposited on said surface in accordance with the stored model.

2. A method for figuring the surface of an optical element comprising the steps of:
    sputtering material from a source onto the surface of the optical element,
    moving the optical element relative to the source to vary the amount of material deposited on the surface in accordance with a predetermined surface figure,
    periodically measuring the figure of the surface,
    comparing the measured figure with a desired figure for generating signals for moving the optical element relative to the source to cause the measured figure to simulate the desired figure.

3. A method according to claim 2 including the step of:
    stamping out a blank with a specular surface and a figure approximating the desired figure prior to the steps of sputtering and moving.

4. A method according to claim 3 including the steps of:
    providing a vacuum around the source and optical element.

* * * * *